United States Patent [19]

Hollingsworth

[11] 4,321,492
[45] Mar. 23, 1982

[54] TWO INPUT SENSE CIRCUIT

[75] Inventor: Richard J. Hollingsworth, Princeton, N.J.

[73] Assignee: RCA Corporation, New York, N.Y.

[21] Appl. No.: 84,712

[22] Filed: Oct. 15, 1979

[51] Int. Cl.³ .............. H03K 5/18; H03K 3/353; H03K 3/286; G11C 7/06
[52] U.S. Cl. ............... 307/530; 307/362; 307/238.8; 307/279
[58] Field of Search .......... 307/362, 262, 304, 351, 307/530, 238.8, 279

[56] References Cited

U.S. PATENT DOCUMENTS

| | | | |
|---|---|---|---|
| 3,962,589 | 6/1976 | Priel et al. | 307/262 |
| 4,060,740 | 11/1977 | Nishimura | 307/362 |
| 4,072,868 | 2/1978 | De La Moneda et al. | 307/304 |
| 4,096,401 | 6/1978 | Hollingsworth | 307/362 |
| 4,107,556 | 8/1978 | Stewart et al. | 307/362 |
| 4,110,639 | 8/1978 | Redwine | 307/362 |
| 4,114,055 | 9/1978 | Hollingsworth | 307/362 |
| 4,170,741 | 10/1979 | Williams | 307/362 |
| 4,179,626 | 12/1979 | Oehler | 307/362 |
| 4,196,363 | 4/1980 | Malaviya | 307/362 |
| 4,216,390 | 8/1980 | Stewart | 307/279 |

*Primary Examiner*—Saxfield Chatmon, Jr.
*Attorney, Agent, or Firm*—Samuel Cohen; Henry I. Schanzer

[57] ABSTRACT

The sense circuit includes two "skewed" inverters. The inverters are skewed in that their switching point is set closer to one (e.g. $V_{HIGH}$) of the inverter operating potentials than to the other potential (e.g. $V_{LOW}$). Therefore, the skewed inverters respond earlier to signals making a transition from a first level to a second level than to signals, of like slope, making a transition from the second to the first level. Each inverter is connected at its input to a different one of first and second bit lines and the output of each inverter is connected to the input of the other via a gating transistor whose conductivity is controlled by the output of the other inverter. Skewing the inverters enables sequential operation of the inverters of the circuit. The first inverter to sense a transition on one line going from the first to the second level, charges the other line and the input of the second inverter to the first level via a gating transistor which is turned off only after the other line reaches the first level. The ouput of the second inverter then goes to the second level and is coupled to the one line via a gating transistor whose turn on is controlled by the output of the first inverter. The sense circuit is well suited for use with a memory cell of the type having output terminals at which complementary signals are produced and which, for any binary condition, provides active drive to only one of the bit lines and a passive high impedance drive to the other bit line permitting it to float over a wide range of potential.

17 Claims, 4 Drawing Figures

TWO INPUT SENSE CIRCUIT

This invention relates to sense circuits such as may be used, for example, in memories.

In the accompanying drawing like reference characters denote like components; and FIG. 1 is a schematic diagram of a sense amplifier embodying the invention coupled to the outputs of a memory cell;

Figure 1:
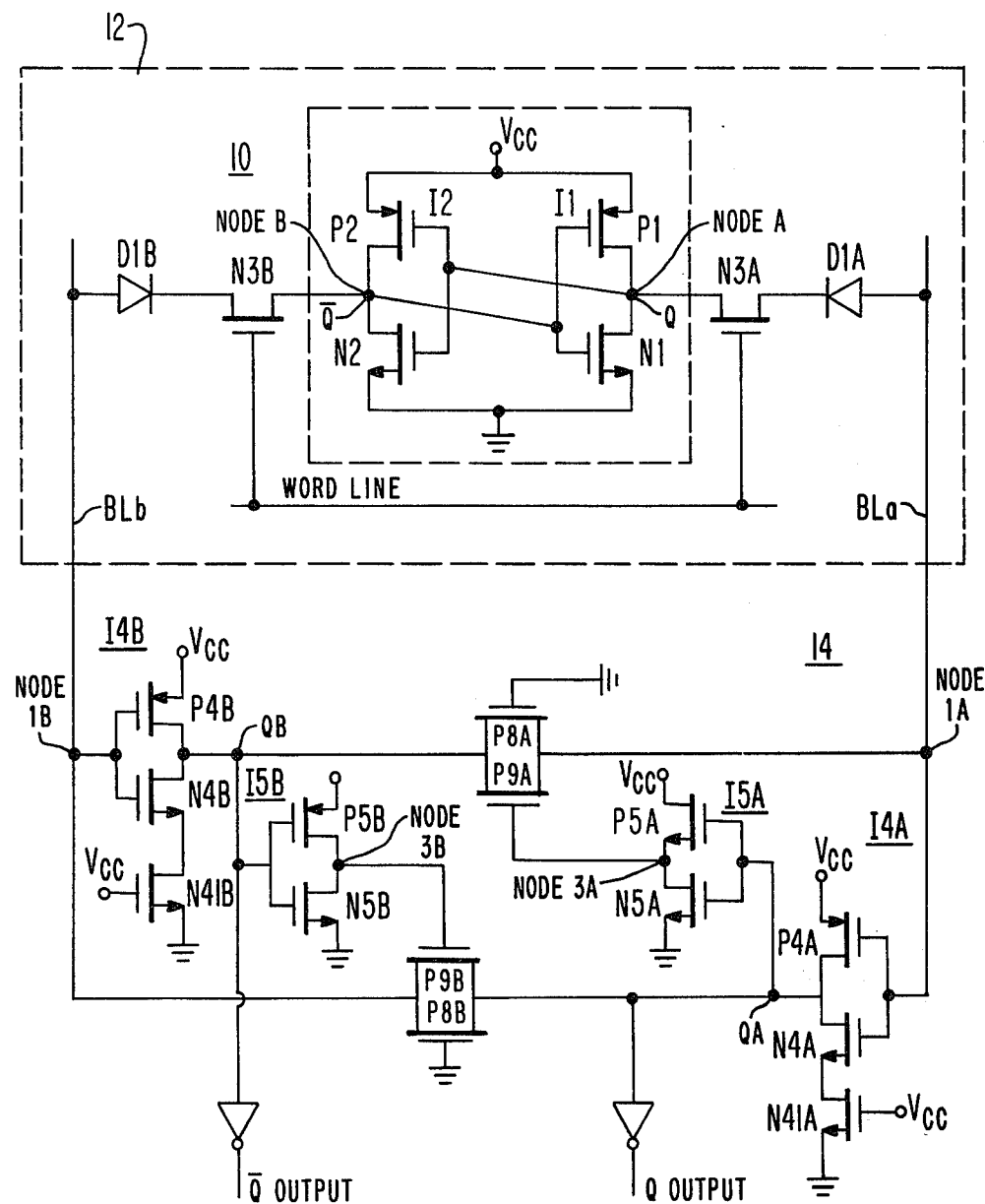

A problem in sensing certain signals is best understood by reference to the circuit of FIG. 1 which includes one cell 10 of a memory array 12 of cells to be sensed by a sense amplifier 14. The cell includes a storage element 16 comprised of two cross-coupled complementary inverters I1 and I2. The input of inverter I2 and the output of inverter I1 are connected to a node A which defines the Q output of flip-flop 16. The input of inverter I1 and the output of inverter I2 are connected to a node B which defines the Q̄ output of flip-flop 16.

A diode D1A is connected in series with a gating ("pass") transistor N3A between node A and a bit line BLa. A diode D1B is connected in series with a gating transistor N3B between node B and a bit line BLb. Diodes D1A and D1B are poled to conduct current from their associated bit lines into their associated nodes. A word line is connected to the gate electrodes of transistors N3A and N3B. For the N type gating transistors shown, a high ($=V_{CC}$) signal on the word line turns on transistors N3A and N3B and selects cell 10 for read-out or write.

The operation of the cell is detailed in my copending application filed on or about Aug. 28, 1979 titled, BLOCKED SOURCE NODE FIELD EFFECT CIRCUITRY bearing Ser. No. 070,509, and also assigned to the assignee of the present application. Suffice it to say that due to diodes D1A and D1B, a "low" stored at node A or node B is tightly coupled via the forward conduction of diode D1A or D1B to its associated bit line. (Actually the bit line will be offset from ground by the forward voltage drop ($V_F$) of the conducting diode.) But, when a "high" is stored at node A or node B, diode D1A or D1B is reverse biased (or non-conducting) and its corresponding bit line is then effectively "floating" since it is not clamped to any potential and it can assume any voltage between 0 volts and $V_{CC}$ volts. Thus, whenever information is read-out of memory cell 10, the information on one bit line is well defined (clamped to ground or to $V_F$ volts above ground) while the information on the other line is ambiguous (floating at any voltage between ground and $V_{CC}$).

A sense circuit embodying the invention includes means for sensing which one of two input lines has a well defined signal applied to it and in response thereto establishes a complementary condition on the other line.

The sense circuit includes first and second inverters which are "skewed" in that their switching point is offset or shifted with respect to their normal range of operation. That is, their switching point is set closer to one (e.g. $V_{HIGH}$) of the inverter's operating potentials than to the other (e.g. $V_{LOW}$). Consequently, the inverters respond earlier to an input transition going from a first to a second level than to an input transition, of like slope, going from the second level to a first level. The first inverter is connected at its input to one of two lines and at its output via a first gating means to the other line. The second inverter is connected at its input to the other line and at its output via a second gating means to the one line. The conductivity of the first and second gating means is controlled by the output of the second and first inverters, respectively. This enables the inverter sensing, an input transition going from a first to a second level to drive the other line and the input of the other inverter to the first level.

The active devices which are preferred for use in practicing the invention are those of a class known in the art as insulated-gate field-effect transistors (IGFETs). For this reason, the circuit is illustrated in the drawing as employing such transistors and will be so described hereinafter. However, this is not intended to preclude the use of other suitable devices and to this end, the term "transistor," when used without limitation in the appended claims, is used in a generic sense.

In the FIGURES, enhancement type IGFETs of P conductivity type are identified by the letter P followed by a particular reference numeral; enhancement type IGFETs of N-conductivity type are identified by the letter N followed by a particular reference numeral; and depletion type IGFETs are identified by the letter D following the letter (N or P) indicating its conductivity type. The characteristics of IGFETs are well known and need not be described in detail. But, for a clearer understanding of the description to follow, the following definitions and characteristics pertinent to the invention are set forth:

1. Each IGFET has first and second electrodes which define the ends of its conduction path and a control electrode (gate) whose applied potential determines the conductivity of its conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having the less positive (lower) potential applied thereto.

2. Conduction occurs when the applied gate-to-source potential ($V_{GS}$) is in a direction to turn on the transistor and is greater in magnitude than a given value, which is defined as the threshold voltage ($V_T$) of the transistor. To turn on a P-type enhancement IGFET its gate voltage ($V_G$) has to be more negative than its source voltage ($V_S$) by at least $V_T$. To turn on a N-type enhancement IGFET its $V_G$ has to be more positive than its $V_S$ by $V_T$. Depletion type transistors conduct even when their $V_{GS}$ is zero.

3. IGFETs are bidirectional in the sense that when an enabling signal is applied to the control electrode, current can flow in either direction in the conduction path defined by the first and second electrode, i.e. the source and drain are interchangeable.

In the discussion to follow, a potential at, or near ground is arbitrarily defined as a logic "0" or "low" condition and any potential at or near $+V_{CC}$ or $+V$ volts is arbitrarily defined as a logic "1" or "high" condition.

Referring to FIG. 1, the sense amplifier 14 includes first, I4A, and second, I4B, inverters connected at their inputs to nodes 1A and 1B, respectively; where nodes 1A and 1B are common to bit lines BLa and BLb, respectively.

Inverters I4A and I4B are highly skewed in that their switching point (e.g. when their input and output voltages are equal) is set close to $[V_{CC}-V_T]$ volts (e.g. the switching points much closer to $V_{CC}$ than to ground). As a result, the switching point of these inverters is reached "earlier" for negative going transitions than for positive going transitions, assuming the fall and rise times of the transitions to be linear and equal (whereby their slopes are equal but opposite in direction) and the response of the inverters are assumed to be measured from the onset of the transitions ($t_0$).

As used herein and in the appended claims, "skewing" refers to offsetting or shifting the switching (trip or threshold) point of an inverter with respect to its normal range of operation (midway between high and low input levels).

Each one of inverters I4A and I4B includes a P-type IGFET (P4A, P4B) whose conduction path is connected between $V_{CC}$ and the inverter output (QA, QB) and two N-type IGFETs (N4A–N41A and N4B–N41B) having their conduction paths connected in series between the inverter output terminal (QA, QB) and ground potential. The gates of N4A and P4A and the gates of N4B–P4B are, respectively, connected to the inverter input nodes 1A and 1B. The drains of N4A–P4A and the drains of N4B–P4B are connected to their respective inverter output terminals QA, QB. N41A and N41B are relatively high impedance devices and their gates are connected to a fixed potential, $V_{CC}$ whereby they function as current sources in series with N4A and N4B, respectively. Transistors N41A and N41B function to make the effective output impedance between the inverter output and ground much greater than that between the inverter output and $V_{CC}$. Consequently, as soon as P4A (or P4B) conducts, the output of its inverter is driven to, or close to, $V_{CC}$ volts. Note that P4A and P4B conduct as soon as their gate voltage ($V_{IN}$) is somewhat less positive than $[V_{CC}-V_T]$ volts; where $V_T$ is the threshold voltage of transistors P4A or P4B. For example, if a $V_{IN}$ which is less positive than $[V_{CC}-V_T]$ volts but more positive than the $V_T$ of N4B is applied to the gates of P4B and N4B, P4B and N4B are turned on, and N41B is already biased on. A current flows through the conduction paths of the three transistors (P4B, N4B and N41B). But, since N4B and N41B have a much higher effective impedance than P4B, the output of the inverter goes close to $V_{CC}$.

When $V_{IN}$ is more positive than $V_{CC}-V_T$, P4B (or P4A) is turned off, and N4B and N41B (or N4A and N41A) which are turned on, pull the inverter output to ground.

Consequently, the current sources (N41A, N41B) ensure that the trip point, or switching point, of the inverter which is defined as the value of the inverter input signal, $V_{IN}$, (at node 1A or 1B) for which the inverter output, $V_0$, (at QA or QB) switches from high to low or low to high is set such that when $V_{IN}$ is below (less positive than) $[V_{CC}-V_T]$ volts, $V_0$ is high and when $V_{IN}$ is above (more positive than) $[V_{CC}-V_T]$ volts, $V_0$ is low.

Figure 2:
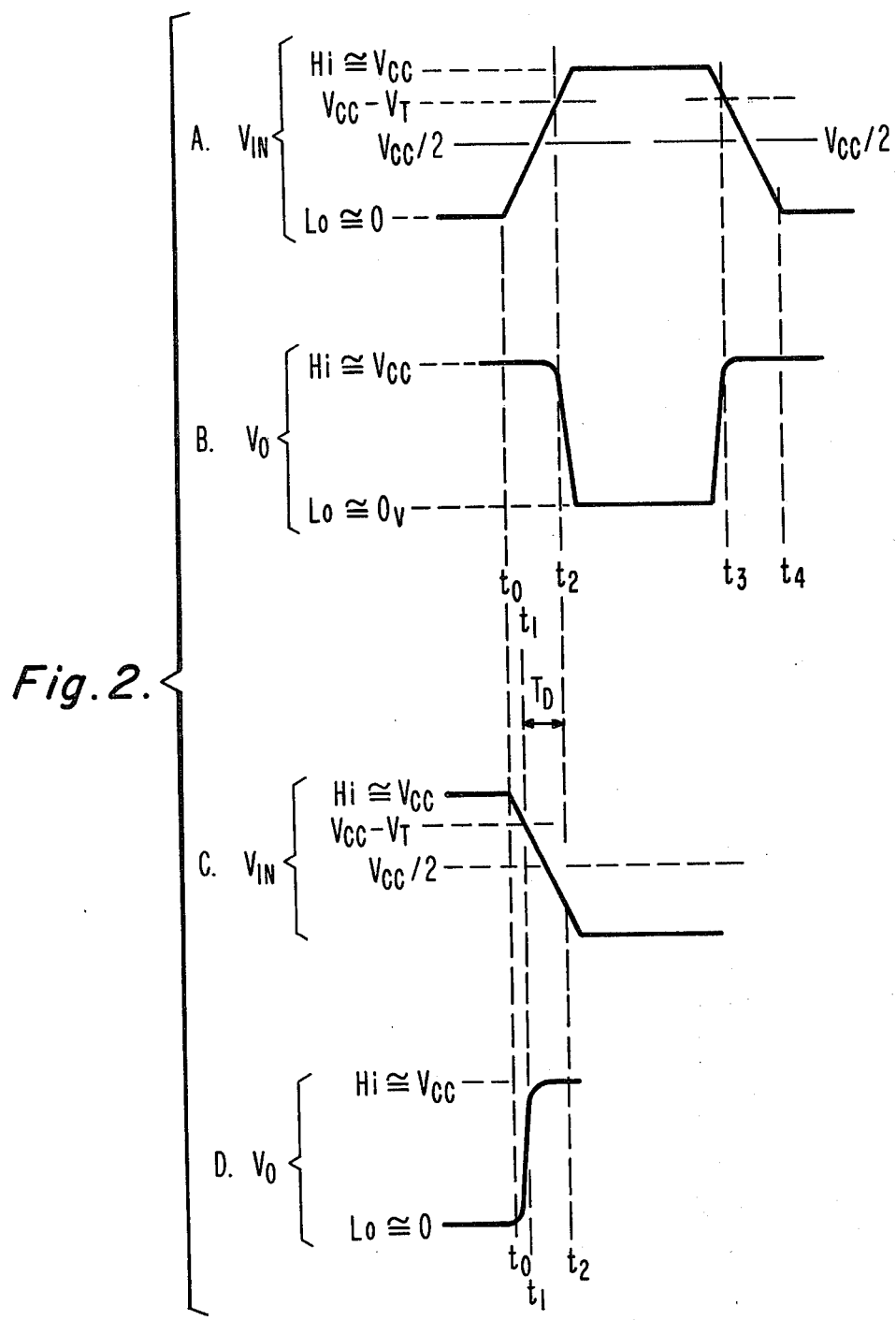
FIG. 2 is a drawing of idealized waveforms associated with various points of the circuit of FIG. 1.

In response to input ($V_{IN}$) transitions of the type shown in waveforms A and C of FIG. 2, inverters I4A and I4B produce output signals ($V_0$) of the type shown in waveforms B and D. Waveforms C and D of FIG. 2 in combination with waveforms A and B illustrate the time delay ($T_D$) due to skewing.

In response to a negative going (hi-to-lo) transition (see waveform C) applied to one inverter and a positive going (lo-to-hi) transition (waveform A) applied to the other inverter, the output of the one inverter (see waveform D) will switch (from lo-to-hi) a time $T_D$ before the output of the other inverter will switch (from hi-to-lo)—see left hand portion of waveform B.

As shown in FIG. 2, a negative going transition requires a time $t_0-t_1$ to go from $V_{CC}$ to $[V_{CC}-V_T]$ while a positive going transition requires a time $t_0-t_2$ to go from 0 volts to $[V_{CC}-V_T]$ volts. The primary effect of skewing the inverters is to cause them to respond earlier to input signals making a transition of one polarity (negative for FIG. 1) than to input signals making a transition of opposite polarity. Once the switching point is reached, the speed with which the inverter output ($V_0$) switches from one level to the other need not be significantly affected (though dependent on a particular design, it may be). The importance of skewing is further discussed below.

Returning to FIG. 1, the conduction paths of transistors P8B and P9B are connected in parallel between the output of inverter I4A and bit line BLb and the conduction paths of transistors P8A and P9A are connected in parallel between the output of inverter I4B and bit line BLa.

The gate electrodes of transistors P9A and P9B are connected, respectively, to the outputs of inverters I5A and I5B, whose inputs are respectively connected to the outputs of inverters I4A and I4B. The gate electrodes of P8A and P8b are grounded. Thus, while the signals applied to the gate electrodes of P9A and P9B are a function of the signals on the bit lines, P8A and P8B provide a continuous conduction path. But, as discussed below, P8A and P8B are relatively high impedance devices compared to P9A and P9B and function to pass just sufficient current to overcome the undesirable parasitic leakage at any nodes.

There is associated with lines BLa (node 1A) and BLb (node 1B) capacitance (not shown) which is charged up to $V_{CC}$ or discharged to ground, depending on the value of the signal read out of or written into, a memory cell.

The operation of the sense amplifier may be best understood by first examining a condition of the amplifier prior to the read out of new information from the memory cell.

Assume that BLa is "low" and that BLb is "high." BLa-low causes QA to be high (P4A conducts and N4A is cut off) and BLb high causes QB to be low (N4B and N41B conduct and P4B is cut off). Consequently, the output of I5A is low and the output of I5B is high. As a result P9A is turned on hard and P9B is turned off. QA high is applied to the source electrode of grounded gate, high impedance, transistor P8B which passes a current into node 1B and ensures that BLb remains high. As noted above, P8B is a high impedance device which passes only sufficient current to overcome the leakage current associated with node 1B. QB-low is coupled to node 1A via P8A and P9A which are both turned on. P8A whose gate, source, and drain electrodes are grounded conducts no current. P9A which is turned on hard couples QB low to node 1A via a low impedance path. But, once nodes 1A and QB is at, or close to, ground P9A conducts no current. However, if node 1A tries to rise $V_T$ volts above ground, P8A and/or P9A, conduct reestablishing the low. Thus, QA high is weakly coupled to node 1B via P9A connected in parallel with P8A.

Assume now that $\overline{Q}$ is low and Q is high and the memory cell is read out by the application of a turn on signal to the gates of pass transistors N3A and N3B. Assume also, for purpose of this example that BLa initially is at ground level (zero volts) and BLb initially is high at $V_{CC}$. With $\overline{Q}$ low, current is sunk from BLb via the forward path of D1B and the conduction paths of N3B and N2 to ground. Line BLb is quickly discharged from $V_{CC}$ volts towards ground and eventually will be clamped close to ground potential (actually at, or close to, one diode drop ($V_F$) above ground due to $V_F$ of D1B). Concurrently, Q-high is blocked by D1A from being applied to BLa. Thus, BLa will be "floating" at or close to the potential it had prior to read out (which in this example is zero volts).

As noted above, I4A and I4B are highly skewed. The relative impedances of P4B to N4B and N41B are such that as soon as P4B conducts (in response to BLb going low), the inverter output is switched from 0 volts to $V_{CC}$. Therefore, as soon as BLb goes from $V_{CC}$ to $[V_{CC}-V_T]$, volts, QB switches from low to high.

During the time that BLb is going from $V_{CC}$ to $V_{CC}-V_T$, there is little, if any change on BLa. Due to the bit line capacitance, BLa remains at, or close to, its initial value (e.g. between 0 and $V_T$ volts based on the assumptions made above). Consequently, P4A conducts while N4A is turned off and N41A does not conduct, with QA-high and node 3A low as just prior to the initiation of read out.

However, as soon as QB goes high, P9A which is turned on by the low at node 3A couples QB high via a low impedance path onto node 1A. Since P9A is a turned on transmission gate transistor, there is no "stage" delay in the conduction of current from QB via the conduction path of P9A. (However, due to the resistance (R) of the transmission gate and the capacitance (C) of the bit line, there is an RC rise time associated with node 1A). Inverter I4B thus drives node 1A and the input of I4A to $V_{CC}$ volts. Therefore, the potential at node 1A reaches $[V_{CC}-V_T]$ sometime after the output of inverter I4B has switched from low to high. As soon as the potential at node 1A rises above $V_{CC}-V_T$, P4A is turned off and N4A is turned on pulling QA to ground.

When QA goes low, P9A has completed the task of coupling the high output of QB to node 1A and is now turned off since when QA goes low the output of I5A is driven high turning off P9A. Allowing P9A to be turned on longer could interfere with the next read-out cycle as further described below. Although P9A is turned off P8A continues to provide a high impedance conduction path between QB and node 1A to compensate for any leakage at node 1A to counteract any tendency for the voltage at 1A to change in value.

When QB first when high, BLb was being pulled low via the memory cell and QA was high. If P9B were turned on immediately, the high at QA would tend to counteract the establishment of the low at BLb. Accordingly, complementary inverter I5B is skewed (as is I5A) to ensure that P9B turns on only after QB is at or close to $V_{CC}$.

The shape of the transfer curve and hence the switching point of a complementary inverter is dependent (among others) on the characteristics and impedances of the N and P transistors forming the inverters. The impedance (Z) of each transistor is in turn a function of the ratio of its channel length (L) to its channel width (W), $[Z=f(L/W)]$. The switching point of the inverters may then be controlled by proper selection and design of the width to length (W/L) ratios of the IGFETs forming the inverters; [This assumes that the other IGFET parameters, (e.g. the threshold voltages, oxide thickness, doping levels), are the same.] Thus, P5B (or P5A) will be a much larger device than N5B (or N5A). The output of inverter I5B is designed to go low concurrently with the switching of QA from high to low. When the output of I5B goes low transistor P9B is turned on hard and helps in the further discharge of BLb towards ground potential.

Thus, immediately following the read of $\overline{Q}$ low and Q high, bit line BLb is actively driven by the memory cell to ground (low) while bit line BLa is driven by the sense amplifier to, or close to, $V_{CC}$ (high) volts.

It has been shown that when the sense circuit determines that a bit line (e.g. BLa) is not sinking current, it restores that line to $V_{CC}$ via a low impedance path, and once that line is pulled up to $V_{CC}$ the circuit only supplies a small current via a high impedance path to hold that line at $V_{CC}$. In the circuit of FIG. 1 restoring the voltage on a line and the maintaining of the voltage is accomplished by means of two P-type IGFETs (P8A, P9A, and P8B, P9B) having their conduction paths connected in parallel in each feed through path. One IGFET (P8A, P8B) in each feed through path passes only a small current to compensate for leakage and to keep the bit line at $V_{CC}$. The other IGFET in each path enables the passage of a high current which quickly brings up the bit line which is not sinking current to, or close to, $V_{CC}$ volts (actually $V_{CC}-V_T$); when it then shuts off.

Another important feature of the circuit is that, as demonstrated above, after the read out of the cell, the sense circuit is set up to easily read the contents of another cell storing the other binary condition. For example, assume that the sense amplifier has just read the contents of a cell where $\overline{Q}$ was low and Q was high, whereby BLa is high and BLb is low, and that in the next cell to be read $\overline{Q}$ is high and Q is low. Q-low read out from the next cell must drive node 1A and BLa which are high, to the low level. But, this presents no problem since node 1A is only weakly coupled to QB via high impedance transistor P8A while P9A is turned off.

Clearly, the circuit is fully static and requires no clocking or precharge. The circuit simply looks at which of the two bit lines is sinking a current and responds accordingly. The inverter sensing the well defined current sinking condition on one line initiates a sequence which will cause the other line to be charged up to the complementary condition.

Figure 3:
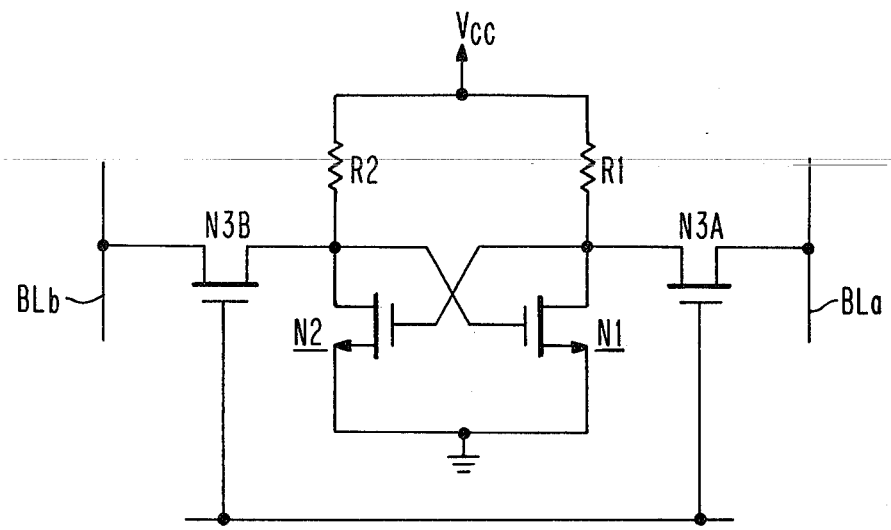
FIG. 3 is a schematic diagram of a memory cell suitable for use with a sense circuit embodying the invention.

The sense circuit has been shown in combination with a memory cell in which one of the bit lines is decoupled (due to a reverse biased diode) from the cell during readout. The circuit of the invention would also be particularly useful with a memory cell of the type shown in FIG. 3 where the blocking diodes (D1A, D1B) would be shorted out and P1 and P2 would be replaced by high impedance load (R1, R2) devices. A "low" memory cell output would actively drive and tightly couple the bit line associated with that output while a "high" memory cell output would drive the other bit line via a high impedance source. If the impedances R1 and R2 were very high (10 to 50 megohms) the bit line driven to the high condition would effectively float. It is evident that resistors R1 and R2 could be replaced by depletion mode transistors of the same conductivity type (e.g. N-channel) as the enhancement transistors (e.g. N1, N2).

Figure 4:
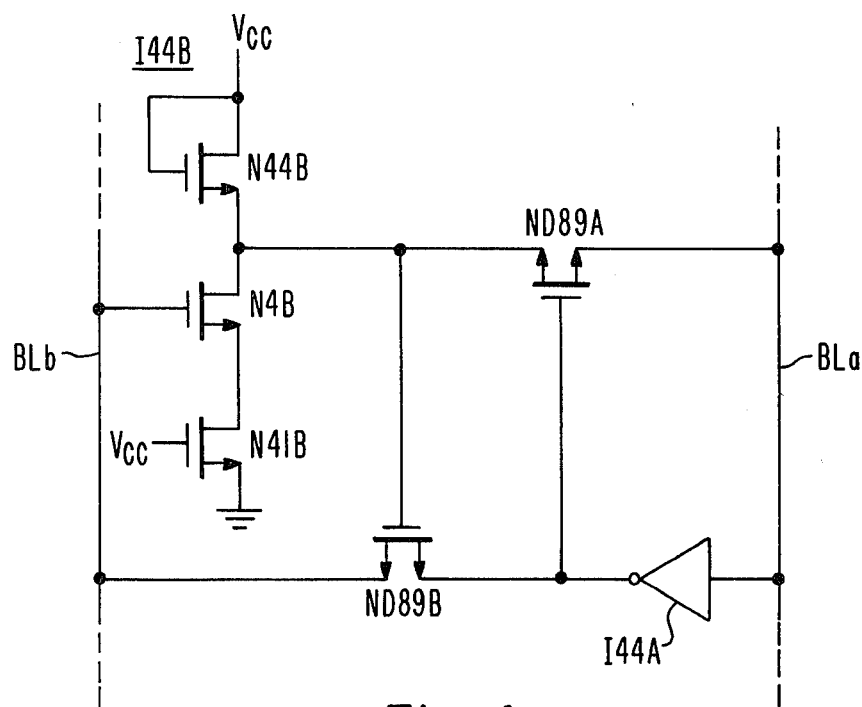
FIG. 4 is a schematic diagram of another sense circuit embodying the invention.

The sense circuit of FIG. 1 uses transistors of complementary conductivity type but a sense circuit embodying the invention could be formed using transistors of single conductivity type as shown in FIG. 4. Two skewed inverters I44A and I44B are connected at their inputs to bit lines BLa and BLb, respectively, and are connected at their outputs via depletion transistors ND89A and ND89B to bit lines BLb and BLa, respectively. As detailed for I44B each skewed inverter includes 3 transistors (N44B, N4B and N41B) of the same conductivity type having their conduction paths connected in series between $V_{CC}$ and ground. Transistor N44B with its gate connected to its drain functions as a load device replacing transistor P4B of FIG. 1. Inverters I44A and I44B would dissipate more power than the complementary type of FIG. 1, but their operation would otherwise be similar. By using depletion type transistors a single gating transistor (ND89A or ND89B) can be used in each feedthrough gate to connect the output of one inverter to the input of the other. Depletion type transistors ND89A, ND89B conduct even when their gate to source potential is zero. Thus, when a "low" or zero volts is applied between the gate and source of ND89A or ND89B it conducts although at a very low level equivalent to that provided by P8A and P8B, of FIG. 1. When a "high" or $V_{CC}$ is applied to the gate of ND89A or ND89B it is fully on and conducts a current equivalent to that carried by P8A-P9A or P8B-P9B in FIG. 1. Thus, each pair P8A-P9A and P8B-P9B could be replaced by a single depletion transistor.

In the circuit of FIG. 1, inverters I4A and I4B were skewed with their switching points set close to $V_{CC}$ to sense the well defined current sinking condition of the memory cell. Where the memory cell pass transistors are of opposite conductivity to the type shown in FIG. 1 with the blocking diodes poled in the opposite direction to that shown in FIG. 1, the sense amplifier components and the operation would be the complement of that described. That is, the inverters would then be skewed to sense the well defined current "sourcing" condition of the memory cell and their switching point would be set closer to ground (or the most negative) potential.

Inverters I4A and I4B and inverters I44B and I44A were shown to include 3 transistors, but they could also be formed using two transistor as shown for I5A and I5B or more than three transistors, so long as they could be skewed as desired. Where only two transistors are used to form an inverter one of the two has to be made larger than the other to offset (or skew) the switching point in the desired direction.

What is claimed is:

1. A sense circuit comprising:
   first and second skewed inverters, each inverter having an input and an output, and each inverter responding to an input transition going from a first voltage level, starting at a reference time, to a second voltage level earlier than it responds to an input transition going from said second level starting, at said reference time, to said first level, where the rise and fall times of the transitions are substantially equal;
   two input lines;
   means connecting the input of said first inverter to one of said two lines, and means connecting the input of said second inverter to the other one of said two lines;
   first means coupling the output of said first inverter to the input of said second inverter and second means coupling the output of the second inverter to the input of the first inverter; and
   means responsive to the outputs of said first and second inverters coupled to said second and first means, respectively, for controlling their conductivity and for passing the output signal produced by an inverter whose input undergoes a transition from said first to said second level to the input of the other inverter and causing the output of the other inverter to then go to said second level.

2. The combination as claimed in claim 1 wherein said first means includes a first transistor having its conduction path connected between the output of said first inverter and the input of said second inverter,
   wherein said second means includes a second transistor having its conduction path connected between the output of said second inverter and the input of said first inverter; and
   wherein said means responsive to the outputs of said first and second inverters includes; a third inverter connected at its input to the output of said second inverter and at its output to the control electrode of said first transistor, and a fourth inverter connected at its input to the output of said first inverter and at its output to the control electrode of said second transistor.

3. The combination as claimed in claim 2 wherein said third and fourth inverters are skewed in the same direction as said first and second inverters.

4. The combination as claimed in claim 3 wherein said first means includes a third transistor whose conduction path is connected in parallel with said first transistor,
   wherein said second means includes a fourth transistor whose conduction path is connected in parallel with said second transistor,
   wherein the conduction paths of said third and fourth transistors are of higher impedance than the conduction paths of said first and second transistors for the same value of turn on voltage, and
   wherein a fixed turn on potential is applied to the control electrodes of said third and fourth transistors.

5. The combination as claimed in claim 4 wherein each one of said first and second inverters includes a first inverter transistor of one conductivity type having its conduction path connected between a first point of potential and said inverter output a second inverter transistor of second conductivity type; means connecting the conduction path of said second transistor between said inverter output and a point of fixed potential; and means connecting the control electrodes of said first and second inverter transistors to said inverter input.

6. The combination as claimed in claim 5 wherein said means connecting the conduction paths of said second transistor includes a third inverter transistor of said second conductivity type having its conduction path connected in series with the conduction path of said second transistor, and means for applying a fixed turn on bias to the control electrode of said third inverter transistor.

7. The combination as claimed in claim 3 wherein said first and second transistors are depletion type transistors.

8. The combination as claimed in claim 7 wherein said first and second inverters include transistors of the same conductivity type.

9. A sense circuit comprising:
   first and second skewed inverters each inverter having an input and an output and each inverter responding to an input transition going from a first voltage level to a second voltage level earlier than it responds to an input transition going from said second level to said first level where the rise and fall times of the transitions are substantially equal;
   two input lines;
   means for applying a well defined signal to only one of said two lines causing the potential on said one of said two lines to make a transition from said first to said second level;
   means connecting the input of said first inverter to one of said two lines, and means connecting the input of said second inverter to the other one of said two lines:
   first means coupling the output of said first inverter to the input of said second inverter and second means coupling the output of the second inverter to the input of the first inverter; and
   means responsive to the outputs of said first and second inverters coupled to said second and first means, respectively, for controlling their conductivity and for passing the output signal produced by the inverter whose input undergoes a transition from said first to said second level to the input of the other inverter and causing the output of the other inverter to then go to said second level.

10. A sense circuit for use with a memory cell having complementary outputs coupled to two lines wherein for any one of the two binary conditions read-out of the cell the signal on one of the two bit lines is well defined while the signal on the other line is undefined, said sense circuit comprising:
   first and second skewed inverters, each inverter having an input and an output and, each inverter responding to a transition from a first level to a second level with less delay than it responds to a transition from said second level to said first level;
   means connecting the input of said first inverter to one of said two lines, and means connecting the input of said second inverter to the other one of, said two lines;
   first and second gating transistors each transistor having a conduction path and a control electrode;
   means connecting the conduction path of said first gating transistor between the output of said first inverter and said other line;
   means connecting the conduction path of said second gating transistor between the output of said second inverter and said one line;
   means responsive to the output of said first inverter connected to the control electrode of said second gating transistor for controlling its conductivity; and
   means responsive to the output of said second inverter connected to the control electrode of said first gating transistor for controlling its conductivity.

11. The combination as claimed in claim 10 further including:
   third and fourth gating transistors;
   means connecting the conduction path of said third gating transistors in parallel with that of said first gating transistor,
   means connecting the conduction path of said fourth gating transistor in parallel with that of said second gating transistor; and
   means for applying a potential to the control electrodes of said third and fourth gating transistors.

12. The combination as claimed in claim 11 wherein said third and fourth gating transistors, are of the same conductivity type as said first and second gating transistors, and
   wherein the impedance of the conduction paths of said third and fourth transistors is much greater than the impedance of the conduction paths of said first and second gating transistors, for a like turn on voltage, 13. The combination as claimed in claim 11 wherein said means responsive to the output of said first inverter includes a third inverter connected at its input to the output of said first inverter and at its output to the control electrode of said second gating transistor, and
   wherein said means responsive to the output of said second inverter includes a fourth inverter connected at its input to the output of said second inverter and at its output to the control electrode of said first gating transistor.

14. The combination as claimed in claim 11 wherein each one of said first and second skewed inverters includes a first transistor of one conductivity type and second and third transistors of opposite conductivity type, each transistor having source and drain electrodes defining the ends of its conduction path and a control electrode;
   wherein said first and second transistors have their gate electrodes connected in common to the inverter input, and their drain electrodes connected in common to the inverter output,
   wherein the source electrode of said first transistor is connected to a first point of potential and the conduction path of the third transistor is connected between the source electrode of said second transistor and a second point of potential, and
   wherein a fixed potential is applied to the control electrode of said third transistor.

15. The combination as claimed in claim 10 wherein said first and second gating transistors are depletion type transistors.

16. A sense circuit for detecting complementary signals applied to first and second nodes, where each signal has either a relatively high level ($V_H$) or a relatively low level ($V_L$), and makes a transition from one level to the other level relatively rapidly but does not have a well defined transition from its other level to the one level, comprising:
   first and second inverter means, each having an input and an output terminal, the first inverter means being connected at its input terminal to said first node and the other second inverter means being connected at its input terminal to said second node, each inverter means being skewed in the sense that its switching point is closer to the one level than to the other level;
   first and second feedback circuit means, the first connecting the output terminal of the first inverter means to the second node and the second feedback circuit means connecting the output terminal of the second inverter means to the first node, each feedback circuit means being capable of assuming a relatively high impedance conducting condition and a relatively low impedance conducting condition; and means responsive to the output of the first inverter means, for placing the second feedback circuit means in its high impedance condition, when the output of the first inverter means is at its other level and for initially placing the second feedback circuit in its low impedance condition when the output of the first inverter means is at its one level; and means responsive to the output of the second inverter means for placing the first feedback circuit means in its high impedance condition when the output of the second inverter means is at its other level and for initially placing the first feedback circuit means in its low impedance condition when the output of the second inverter means is at its one level.

17. A sense circuit for detecting complementary signals, one $V_H$ at a relatively high level, the other $V_L$ at a relatively low level, at first and second circuit nodes in a circuit in which when either node is driven to $V_L$ from its high level $V_H$, it tends to assume the level $V_L$ relatively rapidly whereas when either node is driven to $V_H$ from a low level $V_L$, it tends electrically to float at a value lower than $V_H$, comprising, in combination:

first and second inverter means, each having an input and an output terminal, the first inverter means being connected at its input terminal to said first node and the other second inverter means being connected at its input terminal to said second node, each inverter means being skewed in the sense that its switching point is closer to $V_H$ than to $V_L$;

first and second feedback circuit means, the first connecting the output terminal of the first inverter means to the second node and the second feedback circuit means connecting the output terminal of the second inverter means to the first node, each feedback circuit means being capable of assuming a relatively high impedance conducting condition and a relatively low impedance conducting condition; and means responsive to the output of the first inverter means, for placing the second feedback circuit means in its high impedance condition, when the output of the first inverter means is at its relatively low level $V_L$ and for initially placing the second feedback circuit in its low impedance condition when the output of the first inverter means is at its high level $V_H$; and means responsive to the output of the second inverter means for placing the first feedback circuit means in its high impedance condition when the output of the second inverter means is at its relatively low level $V_L$ and for initially placing the first feedback circuit means in its low impedance condition when the output of the second inverter means is at its high level $V_H$.

* * * * *

UNITED STATES PATENT AND TRADEMARK OFFICE
CERTIFICATE OF CORRECTION

PATENT NO. : 4,321,492

DATED : March 23, 1982

INVENTOR(S) : Richard James Hollingsworth

It is certified that error appears in the above-identified patent and that said Letters Patent is hereby corrected as shown below:

Col. 1, line 27 change "Q" to --- $\bar{Q}$ ---.

Col. 3, line 44 "$V_T$is" should be --- $V_T$ is ---.

Signed and Sealed this

Fourteenth Day of December 1982

[SEAL]

Attest:

GERALD J. MOSSINGHOFF

Attesting Officer

Commissioner of Patents and Trademarks